(12) United States Patent
Kikuchi et al.

(10) Patent No.: US 8,586,987 B2
(45) Date of Patent: Nov. 19, 2013

(54) ACTIVE MATRIX SUBSTRATE AND ACTIVE MATRIX DISPLAY DEVICE

(75) Inventors: Tetsuo Kikuchi, Osaka (JP); Shinya Tanaka, Osaka (JP); Junya Shimada, Osaka (JP); Chikao Yamasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/394,621

(22) PCT Filed: May 21, 2010

(86) PCT No.: PCT/JP2010/058666
§ 371 (c)(1),
(2), (4) Date: Mar. 7, 2012

(87) PCT Pub. No.: WO2011/030590
PCT Pub. Date: Mar. 17, 2011

(65) Prior Publication Data
US 2012/0168762 A1    Jul. 5, 2012

(30) Foreign Application Priority Data
Sep. 11, 2009 (JP) ................ 2009-210387

(51) Int. Cl.
H01L 29/04 (2006.01)
H01L 29/15 (2006.01)
G02F 1/1343 (2006.01)
H01L 21/84 (2006.01)

(52) U.S. Cl.
USPC 257/59; 257/72; 257/E27.111; 257/E29.273; 349/149; 438/29; 438/30; 438/34

(58) Field of Classification Search
USPC ............ 257/59, 72, 773, E27.111, E21.413, 257/E21.414, E29.151, E51.006, E51.019, 257/E51.021, E33.111, E29.111, E29.273, 257/E29.291; 438/29, 30, 34, 158; 315/169.2, 169.3; 345/76, 87, 92, 36; 313/500, 505; 359/149
See application file for complete search history.

(56) References Cited

U.S. PATENT DOCUMENTS 5,222,082 A    6/1993    Plus
5,434,899 A    7/1995    Huq et al.
(Continued)

FOREIGN PATENT DOCUMENTS

JP    5-150264 A    6/1993
JP    6-505605 A    6/1994
(Continued)

OTHER PUBLICATIONS

Official Communication issued in International Patent Application No. PCT/JP2010/058666, mailed on Jun. 15, 2010.

*Primary Examiner* — Mary Wilczewski
*Assistant Examiner* — Erik T Peterson
(74) *Attorney, Agent, or Firm* — Keating & Bennett, LLP

(57) ABSTRACT

A second stem wires (17c), formed by a reflective pixel electrode layer formed as a different layer from first stem wires (17a), is provided in such a way as to extend along a long side of its adjacent one of the first stem wires (17a). This makes it possible to achieve a TFT array substrate (1) on which a gate drive circuit (15) and its wires (17a, 17b, 17c, 18) have been monolithically formed, wherein the width of a frame part in which the a gate drive circuit (15) and its wires (17a, 17b, 17c, 18) are formed can be reduced.

9 Claims, 10 Drawing Sheets

(56) References Cited

U.S. PATENT DOCUMENTS

| | | | |
|---|---|---|---|
| 5,929,948 A * | 7/1999 | Ohori et al. | 349/44 |
| 6,028,653 A * | 2/2000 | Nishida | 349/141 |
| 6,066,860 A * | 5/2000 | Katayama et al. | 257/71 |
| 6,400,426 B1 | 6/2002 | Yamazaki et al. | |
| 6,630,687 B1 * | 10/2003 | Koyama et al. | 257/72 |
| 2003/0201728 A1 | 10/2003 | Miyajima et al. | |
| 2003/0222311 A1 | 12/2003 | Kim | |
| 2004/0012058 A1 | 1/2004 | Aoki | |
| 2005/0008114 A1 | 1/2005 | Moon | |
| 2005/0162605 A1 | 7/2005 | Murade | |

FOREIGN PATENT DOCUMENTS

| | | |
|---|---|---|
| JP | 8-87897 A | 4/1996 |
| JP | 10-288797 A | 10/1998 |
| JP | 2003-316284 A | 11/2003 |
| JP | 2004-062160 A | 2/2004 |
| JP | 2005-18031 A | 1/2005 |
| JP | 2005-50502 A | 2/2005 |
| JP | 2005-527856 A | 9/2005 |
| JP | 2009-15049 A | 1/2009 |
| WO | 2011/007479 A1 | 1/2011 |

* cited by examiner

ACTIVE MATRIX SUBSTRATE AND ACTIVE MATRIX DISPLAY DEVICE

TECHNICAL FIELD

The present invention relates to an active matrix substrate on which a driving circuit and its wires have been monolithically formed and an active matrix display device including such a substrate.

BACKGROUND ART

In recent years, cathode-ray tubes (CRTs) has been replaced by rapidly-spreading active matrix display devices, as typified by liquid crystal display devices and organic EL display devices, in which active elements such as TFTs are used, and the active matrix display devices have been widely used in televisions, monitors, cellular phones, etc. by utilizing their features of energy saving, thinness, lightweight, etc.

Among them, electronic apparatuses including small-to-medium-sized display devices, such as cellular phones and PDAs (personal digital assistants) in particular, have started to adopt a gate driver monolithic (GDM) technique based on amorphous silicon for reduction in cost.

For example, Patent Literature 1 discloses a liquid crystal display device including: pixel transistors provided in a display region of the liquid crystal display device; and a gate drive circuit (gate driver), provided in an area around the display region, which includes transistors, the pixel transistors and the transistors being monolithically formed by using an identical amorphous silicon layer.

FIG. 10 is a plan view showing the gate drive circuit of the liquid crystal display device and a wiring region of the gate drive circuit.

As shown in FIG. 10, in the right edge region of the drawing, i.e., in a region (not illustrated) adjacent to the display region of the liquid crystal display device, there are provided driving transistors for driving shift registers. On the other hand, in the left edge region of the drawing, i.e., in a region farthest from the display region, there is provided a wiring region where there are provided a plurality of main wires 150 through which signals are applied to the shift registers.

Further, in the intermediate region of the drawing, i.e., in a region between the wiring region and the region where the driving transistors are provided, there are provided control transistors for the shift registers.

It should be noted that branch wires 160 electrically connecting the main wires 150 and the driving transistors of the shift registers and branch wires 160 electrically connecting the main wires 150 and the control transistors of the shift register are formed by a different layer from the main wires 150. In the configuration of Patent Literature 1, the main wires 150 are formed by the same layer as a pattern of gate wires and gate electrodes, and the branch wires 160 are formed by the same layer as a pattern of data wires and source electrodes.

Further, an electrical connection between the control transistors, an electrical connection between the driving transistors, and an electrical connection between the control transistors and the driving transistors are made by using the same layer as the main wires 150 or the same layer as the branch wires 160.

FIG. 11 is a cross-sectional view, taken along the line G-H of FIG. 10, which shows the appearance of an area of connection between a main wire 150 and a branch wire 160.

As shown in FIG. 11, the main wire 150 is provided on an insulating substrate 170, and the branch wire 160 is provided on a gate insulating film 180 formed in such a way as to cover the main wire 150 and the insulating substrate 170.

Furthermore, there is a passivation film 190 formed in such a way as to cover the branch wire 160 and the gate insulating film 180.

There is a first contact hole 200, which is a hole formed both in the gate insulating film 180 and the passivation film 190 so that part of the main wire 150 is exposed. On the other hand, there is a second contact hole 210, which is a hole formed in the passivation film 190 so that part of the branch wire 160 is exposed.

As shown in FIGS. 10 and 11, the main wire 150 and the branch wire 160 are electrically connected to each other through a connection conductor 220 formed both in the first contact hole 200 and the second contact hole 210, i.e., through the same layer as pixel electrodes electrically connected to drain electrodes of the pixel transistors provided in the display region of the liquid crystal display device.

Patent Literature 1 states that the foregoing configuration allows the gate drive circuit and its wires to be formed at the same time as the display region by directly using the step of forming the display region of the liquid crystal display device, and as such, can integrate the gate drive circuit and its wires without adding a separate manufacturing step, thus achieving a reduction in manufacturing cost.

CITATION LIST

Patent Literature 1
Japanese Translation of PCT International Publication, Tokuhyo, No. 2005-527856 A (Publication Date: Sep. 15, 2005)
Patent Literature 2
Japanese Patent Application Publication, Tokukai, No. 2005-050502 A (Publication Date: Feb. 24, 2005)
Patent Literature 3
Japanese Patent Application Publication, Tokukaihei, No. 8-087897 A (Publication Date: Apr. 2, 1996)
Patent Literature 4
Japanese Translation of PCT International Publication, Tokuhyohei, No. 6-505605 A (Publication Date: Jun. 23, 1994)

SUMMARY OF INVENTION

Technical Problem

As mentioned above, the gate drive circuit and its wires are configured to include the main wires 150, the various transistors provided in the gate drive circuit, the branch wires 160 through which the main wires 150 and the gate or source electrodes of the various transistors are electrically connected, and the wires through which the gate or source electrodes of the various transistors are electrically connected.

In such a display device as a liquid crystal display device in which a gate drive circuit and its wires have been monolithically formed, the gate drive circuit and its wires are generally provided in the right and left frame parts, which are nondisplay regions, of the display device. Therefore, the width of the frame parts is determined by the size and number of components that are provided in the gate drive circuit, the line widths of its wires, the intervals between its wires, etc.

It is desirable that the width of such a frame part be narrow. However, the width of a frame part in a display device having a gate drive circuit monolithically formed by using amorphous silicon is prone to be great.

Since the transistors including the amorphous silicon layer are low in electron mobility, they need to be formed to be large in size in order to satisfy the amount of current required of transistors for use in a gate drive circuit.

Accordingly, in order to reduce the width of such a frame part in a display device having a gate drive circuit monolithically formed by using amorphous silicon, it is necessary to reduce the width of a region where its wires are formed.

However, since, in the configuration of Patent Literature 1, all of the main wires 150 are formed by the same layer as the pattern of gate wires and gate electrodes, the main wires 150, through which different external signals are inputted, need to be placed at a distance from each other. This makes it difficult to reduce the intervals between the main wires 150.

Further, the main wires 150, through which clock signals and the like are supplied to the transistors of the gate drive circuit, need to be made lower in wiring resistance for the prevention of signal delays, and as such, are required to have wide line widths.

Therefore, in the configuration of Patent Literature 1, it is difficult to reduce the width of a region where its wires are formed, and the widths of the frame parts cannot be reduced.

The present invention has been made in view of the foregoing problems, and it is an object of the present invention to provide an active matrix substrate on which a driving circuit and its wires have been monolithically formed, wherein the width of a frame part in which the driving circuit and its wires are formed can be reduced.

Further, it is another object of the present invention to provide an active matrix display device that allows a reduction in the width of a frame part in which the driving circuit and its wires are formed and that has a large display region.

Solution to Problem

In order to solve the foregoing problems, an active matrix substrate of the present invention is an active matrix substrate including an insulating substrate, the insulating substrate having a display region including a plurality of pixel TFT elements and reflective pixel electrodes, the insulating substrate having a peripheral region, surrounding the display region, which includes a plurality of driving TFT elements for driving the pixel TFT elements, the peripheral region further including branch wires electrically connected to the driving TFT elements and first stem wires, electrically connected to the branch wires, through which external signals are inputted, the pixel TFT elements and the driving TFT elements including a gate electrode layer and a source and drain electrode layer, the reflective pixel electrodes being formed by a reflective pixel electrode layer that is different from the gate electrode layer and the source and drain electrode layers, the peripheral region having at least one second stem wire formed therein to extend along long sides of the first stem wires, the first stem wires, the at least one second stem wire, and the branch wires being formed by different layers selected from among the gate electrode layer, the source and drain electrode layer, and the reflective pixel electrode layer, respectively.

Since, in the conventional configuration, the stem wires, through which external signals and the like are supplied, are all formed by the same layer as the gate electrodes, the stem wires, through which different external signals are inputted, need to be placed at a distance from each other. This makes it difficult to reduce the intervals between the stem wires.

Therefore, in the conventional configuration, it is difficult to reduce the width of a wiring region where the stem wires are provided, and the width of a frame part in which the gate drive circuit and its wires are formed cannot be reduced.

According to the foregoing configuration, the first stem wires, the at least one second stem wire, and the branch wires are formed by different layers selected from among the gate electrode layer, the source and drain electrode layer, and the reflective pixel electrode layer, respectively, and the at least one second stem wire is provided in such a way as to extend along a long side of its adjacent one of the first stem wires. Accordingly, the first and at least one second stem wires, through which different external signals are inputted, no longer need to be placed at a distance from each other. This makes it possible to increase the number of first and second stem wires per unit width.

Accordingly, the foregoing configuration makes it possible to achieve an active matrix substrate on which a driving circuit and its wires have been monolithically formed, wherein the width of a frame part in which the driving circuit and its wires are formed can be reduced.

It should be noted that the clause "the at least one second stem wire extends along a long side of its adjacent one of the first stem wires" not only means a case where the second stem wire and the first stem wire run parallel to each other but also includes, to the extent that the number of first and second stem wires per unit width can be increased, a case where the second stem wire and the first stem wire are slightly displaced from running parallel to each other.

In order to solve the foregoing problems, an active matrix display device of the present invention is configured to include such an active matrix substrate.

By including an active matrix substrate that is small in width of a frame part in which the driving circuit is formed, the foregoing configuration makes it possible to achieve an active matrix display device that has a large display region.

Advantageous Effects of Invention

As described above, an active matrix substrate of the present invention is an active matrix substrate including an insulating substrate, the insulating substrate having a display region including a plurality of pixel TFT elements and reflective pixel electrodes, the insulating substrate having a peripheral region, surrounding the display region, which includes a plurality of driving TFT elements for driving the pixel TFT elements, the peripheral region further including branch wires electrically connected to the driving TFT elements and first stem wires, electrically connected to the branch wires, through which external signals are inputted, the pixel TFT elements and the driving TFT elements including a gate electrode layer and a source and drain electrode layer, the reflective pixel electrodes being formed by a reflective pixel electrode layer that is different from the gate electrode layer and the source and drain electrode layers, the peripheral region having at least one second stem wire formed therein to extend along long sides of the first stem wires, the first stem wires, the at least one second stem wire, and the branch wires being formed by different layers selected from among the gate electrode layer, the source and drain electrode layer, and the reflective pixel electrode layer, respectively.

As described above, an active matrix display device of the present invention is configured to include such an active matrix substrate.

This brings about an effect of making it possible to achieve an active matrix substrate on which a diving circuit has been monolithically formed, wherein the width of a frame part in which the driving circuit is formed can be reduced.

This also brings about an effect of making it possible to achieve an active matrix display device that allows a reduction in the width of a frame part in which the driving circuit and its wires are formed and that has a large display region.

DESCRIPTION OF EMBODIMENTS

Embodiments of the present invention are described in detail below with reference to the drawings. However, the dimensions of components described in each of the embodiments, the materials for such components, the positions of such components relative to one another, etc. are merely an embodiment, and the interpretation of the scope of invention should not be limited whatsoever thereby.

Embodiment 1

A configuration of a TFT array substrate 1 serving as an active matrix substrate provided in a liquid crystal display device that is an example of an active matrix display device of the present invention is described below with reference to FIG. 5.

Figure 5:
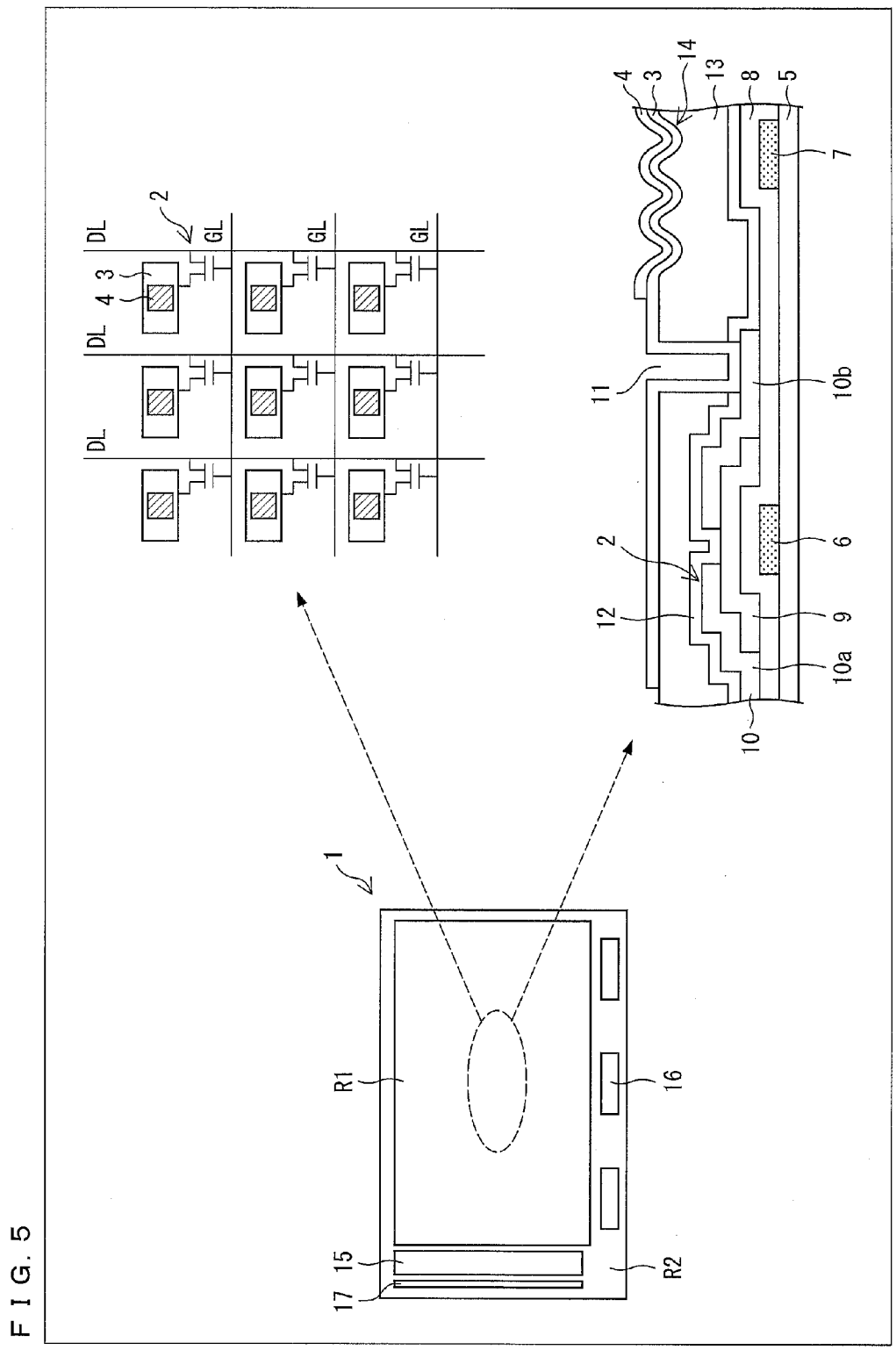
FIG. 5 schematically shows a configuration of a TFT array substrate according to an embodiment of the present invention.

FIG. 5 schematically shows the configuration of the TFT array substrate 1.

As shown in FIG. 5, the TFT array substrate 1 includes a display region R1 and a peripheral region R2 located around the display region R1.

Provided in the display region R1 is a matrix of pixel TFT elements 2, transparent pixel electrodes 3 electrically connected to the pixel TFT elements 2, and reflective pixel electrodes 4 (reflective pixel electrode layer).

Each of the pixel TFT elements 2 includes: a gate electrode layer 6 and a Cs bus line 7, stacked on an insulating substrate 5, which form a gate bus line GL and a gate electrode; a gate insulating film 8 stacked on the insulating substrate 5, on the gate electrode layer 6, and on the Cs bus line 7; an amorphous silicon film 9, stacked on the gate insulating film 8, which serves as a semiconductor film; a source and drain electrode layer 10, stacked on the gate insulating film 8 and the amorphous silicon film 9, which forms a source electrode 10a, a drain electrode 10b, and a data bus line DL; a protective film 12, stacked on the gate insulating film 8, the amorphous silicon film 9, and the source and drain electrode layer 10, in which a contact hole 11 is provided; an interlayer insulating film 13, stacked on the protective film 12, in which the contact hole 11 is provided; and a transparent pixel electrode 3, stacked on the source and drain electrode layer 10 and the interlayer insulating film 13, which has been formed in such a way as to be electrically connected to the drain electrode 10b through the contact hole 11.

Furthermore, over a region where the Cs bus line 7 is provided, the interlayer insulating layer 13 has its upper surface formed in a roundly wavy shape 14.

On that part of the upper surface of the interlayer insulating film 13 which has been formed in the roundly wavy shape 14, the transparent pixel electrode 3 has a wavy shape, and the reflective pixel electrode 4, which is made of a conductor such as Al or Ag having an optical reflectance, has a wavy shape, with the transparent pixel electrode 3 stacked on the interlayer insulating film 13 and the reflective pixel electrode 4 stacked on the transparent pixel electrode 3.

In the present embodiment, the reflective pixel electrode 4 is electrically connected to the transparent pixel electrode 3. However, this does not imply any limitation. Alternatively, the reflective pixel electrode may be provided on the insulating layer without being electrically connected to the transparent pixel electrode.

That is, although, in the present embodiment, the TFT array substrate 1 is a transflective TFT array substrate including (i) transparent electrodes 3 that allow transmission of light from a backlight (not illustrated) provided on a side of the insulating substrate 5 opposite that side of the insulating substrate 5 on which the layers are provided and (ii) reflective pixel electrodes 4 that reflect outside light incident on a side opposite the side on which the backlight is provided, the TFT array substrate 1 may be a reflective TFT array substrate constituted solely by reflective pixel electrodes 4 without being provided with transparent pixel electrodes 3.

It should be noted that it is of course possible to appropriately change the area ratio between the transparent pixel electrode 3 and the reflective pixel electrode 4 in each pixel of the transflective TFT array substrate 1.

Further, in the present embodiment, as shown in FIG. 5, the pixel TFT elements 2 have their gate electrodes at the bottom. However, this does not imply any limitation. Alternatively, the pixel TFT elements 2 may of course have their gate electrodes at the top.

Meanwhile, provided in the peripheral region R2 are a gate drive circuit 15 monolithically formed by using an amorphous silicon film 9 and a source drive circuit 16 formed by using a COG (chip on glass) technique.

The gate drive circuit 15, electrically connected to the gate bus lines GL, and the source drive circuit 16, electrically connected to the data bus lines DL, are configured to control the pixel TFT elements 2 in accordance with external signals.

Provided on the left side, in FIG. 5, of that part of the peripheral region R2 in which the gate drive circuit 15 is provided are gate drive circuit signal wires 17 composed of stem wires, such as clock signal lines and power supply voltage lines, and branch wires through which the stem wires and the gate drive circuit 15 are electrically connected.

As above, monolithically formed in the peripheral region R2 of the TFT array substrate 1 are the gate drive circuit 15 and the gate drive circuit signal wires 17.

Figure 1:
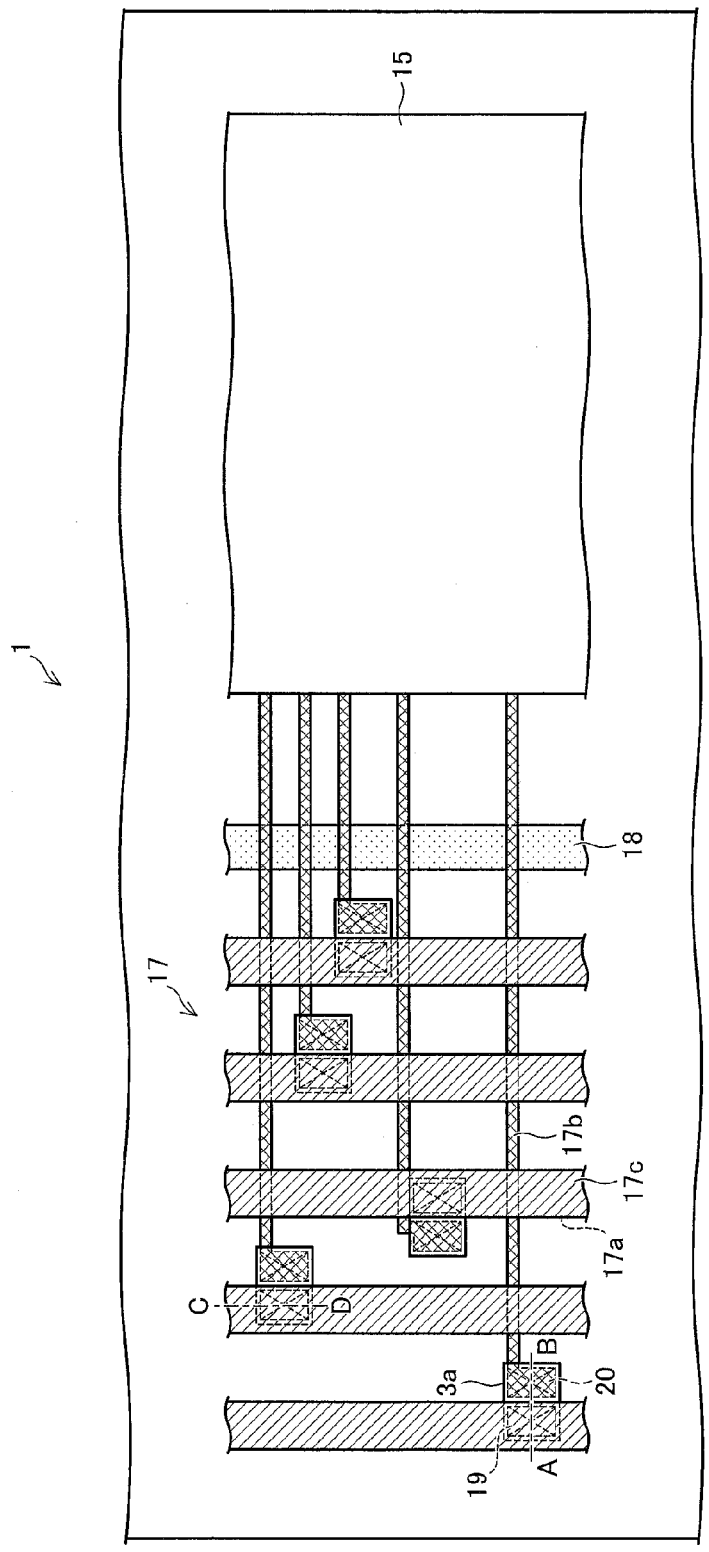
FIG. 1 is a partly enlarged view showing a region in a TFT array substrate according to an embodiment of the present invention where gate drive circuit signal wires are provided.

FIG. 1 is a partly enlarged view showing a region in the TFT array substrate 1 where the gate drive circuit signal wires 17 are provided.

As shown in FIG. 1, the gate drive circuit signal wires 17 are constituted by (i) first stem wires 17a through which clock signals, power supply voltages, and the like are supplied to the gate drive circuit 15, (ii) branch wires 17b through which the first stem wires 17a and the gate drive circuit 15 are electrically connected, and (iii) second stem wires 17c electrically connected to the first stem wires 17a and formed in regions overlapping the first stem wires 17a when seen in a plan view.

Although not illustrated, the gate drive circuit 15 comprises plural stages of gate drive circuits, one of which is shown in FIG. 1.

As shown in FIG. 1, the single stage of gate drive circuit 15 is configured such that a plurality of branch wires 17b electrically connected to a plurality of different first stem wires 17a, respectively, are electrically connected thereto. The present embodiment uses a configuration in which five different types of signals (VSS/CK/CKB/VDD/VSS2) are sent to the single stage of gate drive circuit 15 through five different first stem wires 17a and branch wires 17b. However, the number is not particularly limited, and as such, can of course be changed as needed.

Although not illustrated, the single state of gate drive circuit 15 comprises plural stages of gate drive circuits 15 coupled to each other. A stage of gate drive circuit 15 has its output terminal electrically connected to a gate bus line GL corresponding to an input terminal of a next stage, so that the plurality of gate bus lines GL are selected in sequence by output signals through such output terminals. However, this does not imply any limitation. Alternatively, it is possible to use a configuration in which each stage of gate drive circuit is provided, for example, with two output terminals one of which is electrically connected to the input terminal of the next stage and the other one of which is electrically connected to the gate bus line.

It should be noted that as shown in FIG. 1, there may be provided a separate wire 18 between the gate drive circuit 15 and the five first stem wires 17a (five second stem wires 17c).

The separate wire 18 may take the form of a wire for repairing breakage of a wire in a display region, an inspection signal wire, a wire for use in a counter (common) electrode, an auxiliary capacitor wire, etc.

Figure 2:
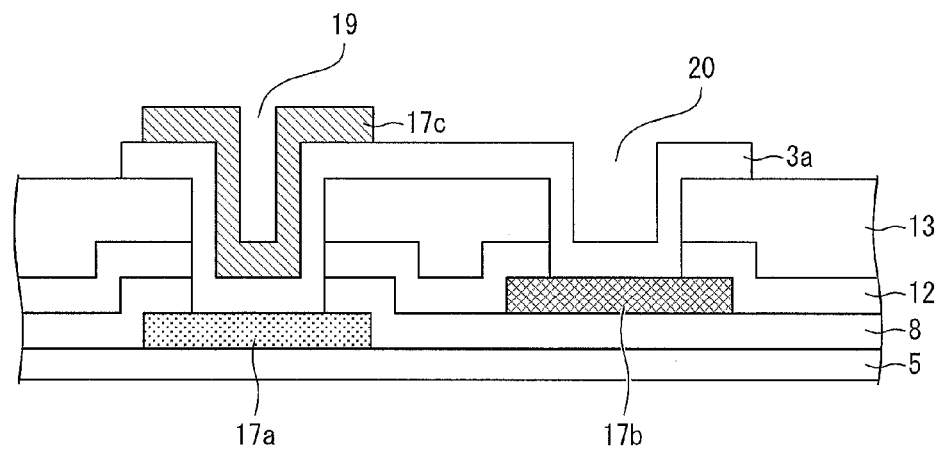
FIG. 2 is a cross-sectional view taken along the line A-B in that part of the region shown in FIG. 1 in which a first stem wire and a branch wire are connected to each other.
Figure 3:
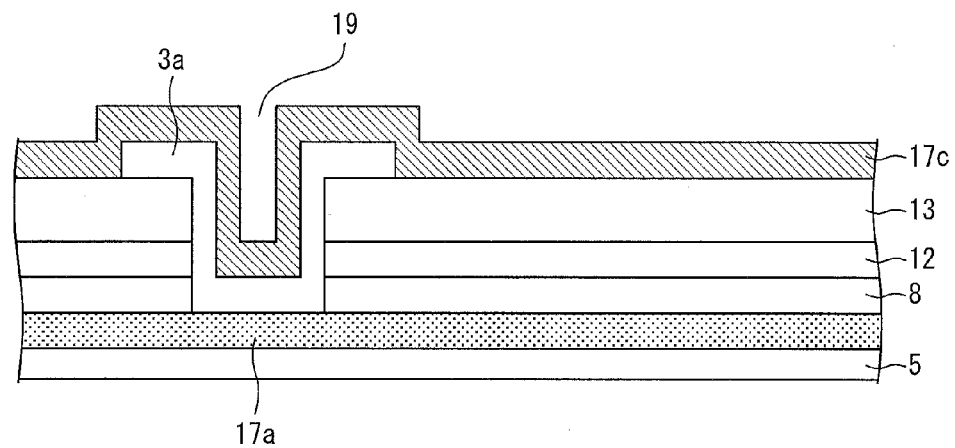
FIG. 3 is a cross-sectional view taken along the line C-D in that part of the region shown in FIG. 1 in which a first stem wire and a second stem wire overlap.

The gate drive circuit signal wires 17 are described further in detail with reference to FIGS. 2 and 3.

FIG. 2 is a cross-sectional view, taken along the line A-B of FIG. 1, which shows an area of connection between a first stem wire 17a and a branch wire 17b.

In the present embodiment, the first stem wire 17a is formed by the same layer as the gate electrode layer 6 of each pixel TFT element 2 shown in FIG. 5, and the branch wire 17b is formed by the same layer as the source and drain electrode layer 10. However, this does not imply any limitation. The first stem wire 17a may be formed by the same layer as the source and drain electrode layer 10, and the branch wire 17b may be formed by the same layer as the gate electrode layer 6.

As shown in FIG. 2, the first stem wire 17a is provided on the insulating substrate 5, and the branch wire 17b is provided on the gate insulating film 8 formed in such a way as to cover the insulating substrate 5 and the first stem wire 17a.

Furthermore, the protective film 12 and the interlayer insulating film 13 are provided in such a way as to cover the gate insulating film 8 and the branch wire 17b.

Further, on the first stem wire 17a, there is a first contact hole 19 formed in the gate insulating film 8, the protective film 12, and the interlayer insulating film 13 so that part of the first stem wire 17a is exposed. On the other hand, on the branch wire 17b, there is a second contact hole formed in the protective film 12 and the interlayer insulating film 13 so that part of the branch wire 17b is exposed.

The first and second stem wires 17a and 17c and the branch wire 17b are electrically connected through a connection conductor 3a formed by the same layer as the transparent electrodes 3 electrically connected to the pixel TFT elements 2 shown in FIG. 5.

As shown in FIG. 5, the TFT array substrate 1, which is transflective, includes the transparent pixel electrodes 3, and in the present embodiment, the first and second stem wires 17a and 17c and the branch wire 17b are electrically connected by using the connection conductor 3a formed by the same layer as the transparent pixel electrodes 3.

Meanwhile, in such a configuration as a reflective configuration including the reflective pixel electrodes 4 instead of the transparent pixel electrodes 3, the first and second stem wires 17a and 17c and the branch wire 17b can also be electrically connected by using a connection conductor formed by the same layer as the reflective pixel electrodes 4.

It should be noted that such a connection conductor be formed by using a conducting layer other than the transparent pixel electrodes 3 and the reflective pixel electrodes 4.

On the connection conductor 3a formed by the same layer as the transparent pixel electrodes 3, the second stem wire 17c is formed by the same layer as the reflective pixel electrodes 4.

In the present embodiment, the first stem wire 17a is formed by the same layer as the gate electrode layer 6 of each pixel TFT element 2, the branch wire 17b is formed by the same layer as the source and drain electrode layer 10, and the second stem wire 17c is formed by the same layer as the reflective pixel electrodes 4. However, this does not imply any limitation. The first stem wire 17a, the second stem wire 17c, and the branch wire 17b need only be formed by different layers selected from among the gate electrode layer 6, the source and drain electrode layer 10, and the same layer as the reflective pixel electrodes 4, respectively.

In a case, albeit not illustrated, where the second stem wire 17c is formed by the same layer as the reflective pixel electrodes 4 and the first and second stem wires 17a and 17c and the branch wire 17b are electrically connected by using a connection conductor formed by the same layer as the reflective pixel electrodes 4, the first stem wire 17a and the branch wire 17b are electrically connected to each other through the second stem wire 17c.

FIG. 3 is a cross-sectional view, taken along the line C-D of FIG. 1, which shows an area of overlap between a first stem wire 17a and a second stem wire 17c.

As shown in FIGS. 2 and 3, the second stem wire 17c extends along a long side of the first stem wire 17a (along a vertical direction in FIG. 1) in such a way as to be located above the first stem wire 17a when seen in a plan view, and is electrically connected to the first stem wire 17a through a connection conductor 3a.

Figure 11:
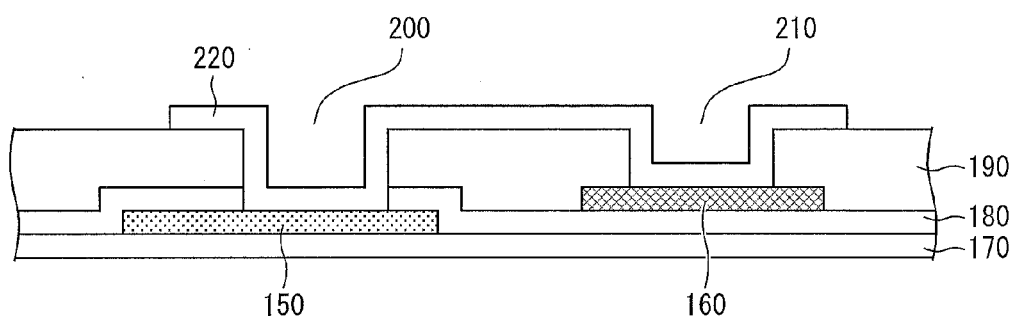
FIG. 11 is a cross-sectional view, taken along the line G-H of FIG. 10, which shows the appearance of an area of connection between a main wire and a branch wire.

In the conventional configuration shown in FIG. 11, the main wires 150, through which external clock signals and the like are supplied, are formed by the same layer as the gate electrodes and need to be made lower in wiring resistance for the prevention of signal delays, and as such, have wide line widths. Therefore, it is difficult to reduce the width of a region in the driving circuit where its wires are formed, and the width of a frame part in which the driving circuit is formed cannot be reduced.

Meanwhile, according to the configuration of the present embodiment, as shown in FIGS. 2 and 3, the second stem wire 17a is formed by the same layer as the reflective pixel electrodes 4 and is electrically connected to the first stem wire 17a.

Accordingly, a combined value of resistance per unit width of stem wires 17a and 17c with the first stem wire 17a electrically connected to the second stem wire 17c is smaller than a value of resistance per unit width of a first stem wire 17a not electrically connected to such a second stem wire 17c.

In such a case, as in the present embodiment, where the first stem wires 17a are formed by the same layer as the gate electrode layer 6, assuming that the sheet resistance ratio of a first stem wire 17a to a second stem wire 17c is 1:2, the ratio of the value of resistance per unit width of a first stem wire 17a to the combined value of resistance per unit width of stem wires 17a and 17c with the first stem wire 17a electrically connected to the second stem wire 17c as can be obtained from a formula of parallel-connected resistors (1/R=1/R1+1/R2) is 3:2.

That is, the forgoing configuration, in which the second stem wire 17c is electrically connected to the first stem wire 17a, can reduce the value of resistance per unit width to ⅔.

Figure 4:
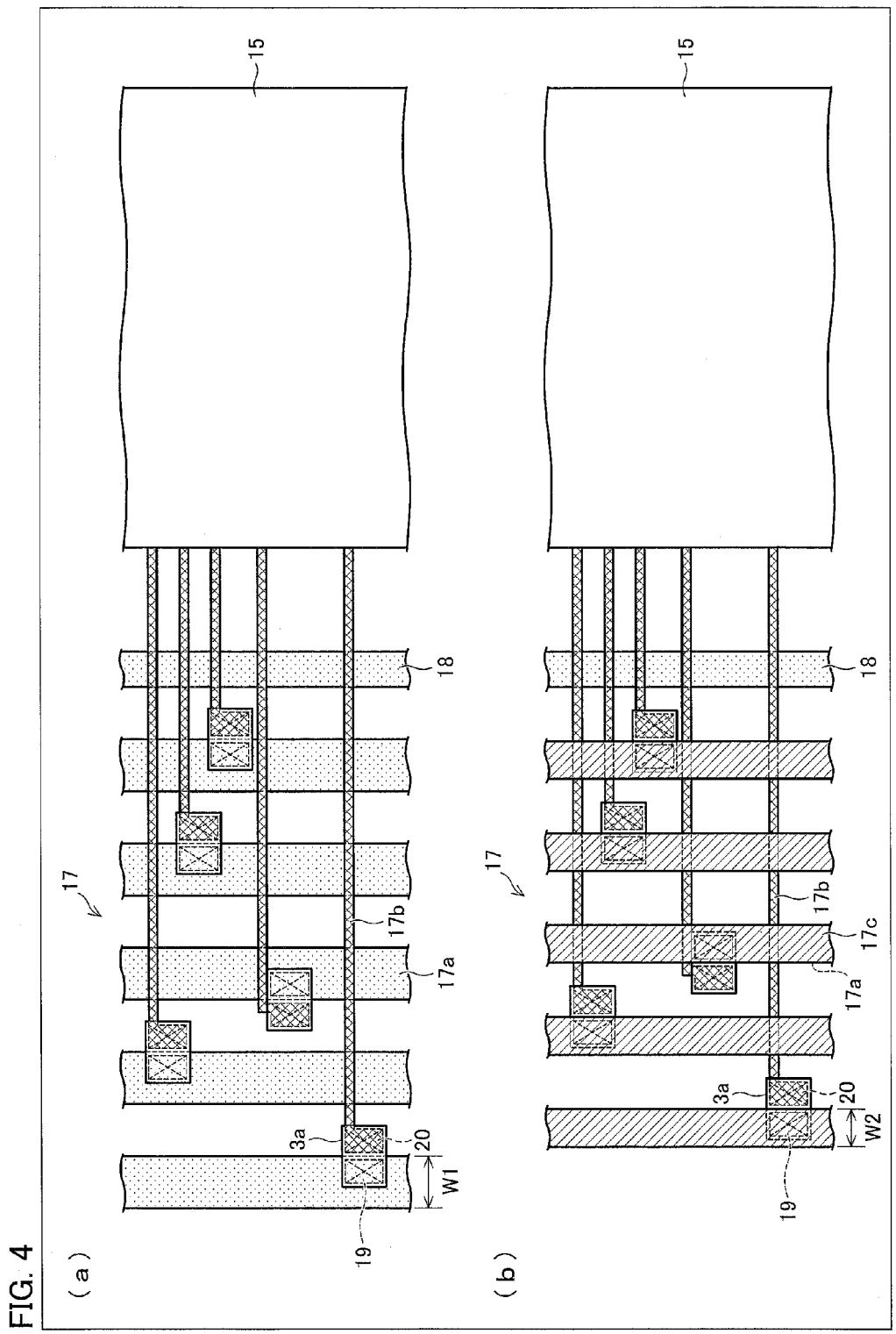
FIG. 4 is a set of diagrams (a) and (b) each showing a region where gate drive circuit signal wires are provided, (a) showing a case where each stem wire is constituted solely by a first stem wire, (b) showing a case of the present embodiment where each stem wire is constituted by a first stem wire and a second stem wire.

(a) of FIG. 4 shows gate drive circuit signal wires each stem wire of which is constituted solely by a first stem wire 17a, and (b) of FIG. 4 shows gate drive circuit signal wires of the present embodiment each stem wire of which is constituted by a first stem wire 17a and a second stem wire 17c.

In such a case, as shown in (a) of FIG. 4, where each stem wire is constituted solely by a first stem wire 17a, the line width W1 of the first stem wire 17a perpendicular to a long side of the first stem wire 17a is wide for lower wiring resistance.

Meanwhile, in such a case, as shown in (b) of FIG. 4, where each stem wire is constituted by a first stem wire 17a and a second stem wire 17c, the value of resistance per unit width can be reduced to ⅔. Therefore, to the extent that the value of resistance per unit width has been reduced, the line width W2 of each of the first and second stem wires 17a and 17b can be reduced.

Accordingly, the ratio of the line width W1 to the line width W2 is 3:2.

It should be noted that in the present embodiment, the second stem wires 17c are disposed above the first stem wires 17a in such a way as to overlap the first stem wires 17a when seen in a plan view.

Further, in the present embodiment, for the purpose of efficient use of a wiring region where the first and second stem wires 17a and 17c are formed, the first and second stem wires 17a and 17c are equal in wire width to each other along a direction perpendicular to their long sides and equal in length along their long sides. However, this does not imply any limitation. As long as the second stem wires 17c overlap the first stem wires 17a when seen in a plan view, the second stem wires 17c do not need to be identical in shape to the first stem wires 17a.

The foregoing configuration, as described above, makes it possible to achieve a TFT array substrate 1 on which a gate drive circuit 15 and gate drive circuit signal wires 17 have been monolithically formed, wherein the width of a frame part in which the gate drive circuit signal wires 17 are formed can be reduced.

In the present embodiment, the first stem wires 17a, i.e., the gate electrode layer 6 can be made, for example, of an aluminum alloy or the like. However, this does not imply any particular limitation. The first stem wires 17a, i.e., the gate electrode layer 6 may be made of an element selected from among Ta, W, Ti, Mo, Al, Cu, Cr, Nd, etc., an alloy material composed mainly of the element, or a compound material composed mainly of the element. Alternatively, the first stem wires 17a, i.e., the gate electrode layer 6 may be made by doping a semiconductor film as typified by polycrystalline silicon with an impurity such as boron.

Further, the branch wires 17b, i.e., the source and drain electrode layer 10 can be made of an aluminum alloy, molybdenum, or a laminated film of them. However, this does not imply any limitation. The branch wires 17b, i.e., the source and drain electrode layer 10 may be formed as a laminated structure, as needed, made of an element selected from among Ta, W, Ti, Mo, Al, Cu, Cr, Nd, etc., an alloy material composed mainly of the element, or a compound material composed mainly of the element.

Further, the transparent pixel electrodes 3 and the connection conductors 3a, which are the same layer as the transparent pixel electrodes 3, can be made by using a transparent conducting layer made of ITO (indium tin oxide), IZO (indium zinc oxide), or the like.

Further, in the present embodiment, as a semiconductor film to be provided in the pixel TFT element 2 and in the driving TFT elements to be described later, the amorphous silicon film 9 is used. However, this does not imply any limitation. The semiconductor film may be made of amorphous germanium, amorphous silicon germanium, amorphous silicon carbide, or the like.

Alternatively, the semiconductor film may be made of polycrystalline silicon, polycrystalline germanium, polycrystalline silicon germanium, polycrystalline silicon carbide, or the like.

Since the driving TFT elements including the amorphous silicon layer as in the present embodiment are low in electron mobility, they need to be formed to be large in size in order to satisfy the amount of current required of TFT elements for use in a driving circuit.

Accordingly, the gate drive circuit 15, which has the driving TFT elements including the amorphous silicon layer, is large in size; therefore, in order to reduce the width of a frame part in which the gate drive circuit 15 and the gate drive circuit signal wires 17 are formed, it is necessary to reduce the width of each of the gate drive circuit signal wires 17.

Therefore, the foregoing configuration makes it possible to realize a TFT array substrate 1 on which a gate drive circuit 15 having driving TFT elements including an amorphous silicon film 9, which is an amorphous semiconductor layer, and its gate drive circuit signal wires 17 have been monolithically formed, wherein the width of a frame part in which the gate drive circuit signal wires 17 are formed can be reduced.

Further, as the gate insulating film 8 and the protective film 12, an inorganic film made of SiNx, SiOx, or the like can be used, for example. However, this does not imply any limitation.

The interlayer insulating film 13 can be formed, for example, by an inorganic film made of SiNx or the like. However, this does not imply any limitation. The interlayer insulating film 13 may be formed by an inorganic film made of SiOx, SiON, or the like. Further, instead of such an inorganic film, an organic film made of transparent acrylic resin having photosensitivity can also be used. Alternatively, the interlayer insulating film 13 may be a laminated structure of an inorganic film and an organic film.

In the present embodiment, in order for the interlayer insulating film 13 to have its upper surface formed partly in a roundly wavy shape 14, the interlayer insulating film 13 is formed by an organic film made of transparent acrylic resin having photosensitivity, and after patterning of a wavy shape, the wavy shape is subjected to melt flow to form a roundly wavy shape.

On that part of the upper surface of the interlayer insulating film 13 which has been formed in the roundly wavy shape 14, the transparent pixel electrode 3 has a finely roundly wavy shape and the reflective pixel electrode 4 has a finely roundly wavy shape, with the reflective pixel electrode 4 stacked on the transparent pixel electrode 3. This makes it possible to create a design that scatters light within a certain range of angles, so that efficient use of ambient light can bring about bright reflection characteristics.

It should be noted that a TFT array substrate of the present embodiment on which a gate drive circuit 15 and its gate drive circuit signal wires 17 have been monolithically formed can be manufactured by directly using the process of manufacturing a transflective TFT array substrate including transparent pixel electrodes 3 and reflective pixel electrodes 4. Further, a TFT array substrate on which a gate drive circuit 15 and its gate drive circuit signal wires 17 have been monolithically formed by electrically connecting the first and second stem wires 17a and 17c and the branch wires 17b through connection conductors formed in the same layer as the reflective pixel electrodes 4 can be manufactured by directly using the process of manufacturing a conventional reflective TFT array including reflective pixel electrodes 4.

Embodiment 2

A second embodiment of the present invention is described below with reference to FIG. 6. The present embodiment differs from Embodiment 1 in that a second stem wires 17c is provided in such a way as to extend along a long side of its adjacent first stem wire 17a and is not electrically connected to the first stem wire 17a. In other respects, the present embodiment is identical in configuration to Embodiment 1 described above. For convenience of explanation, those members having the same functions as those shown in the drawings of Embodiment 1 are given the same reference numerals, and as such, are not described below.

Figure 6:
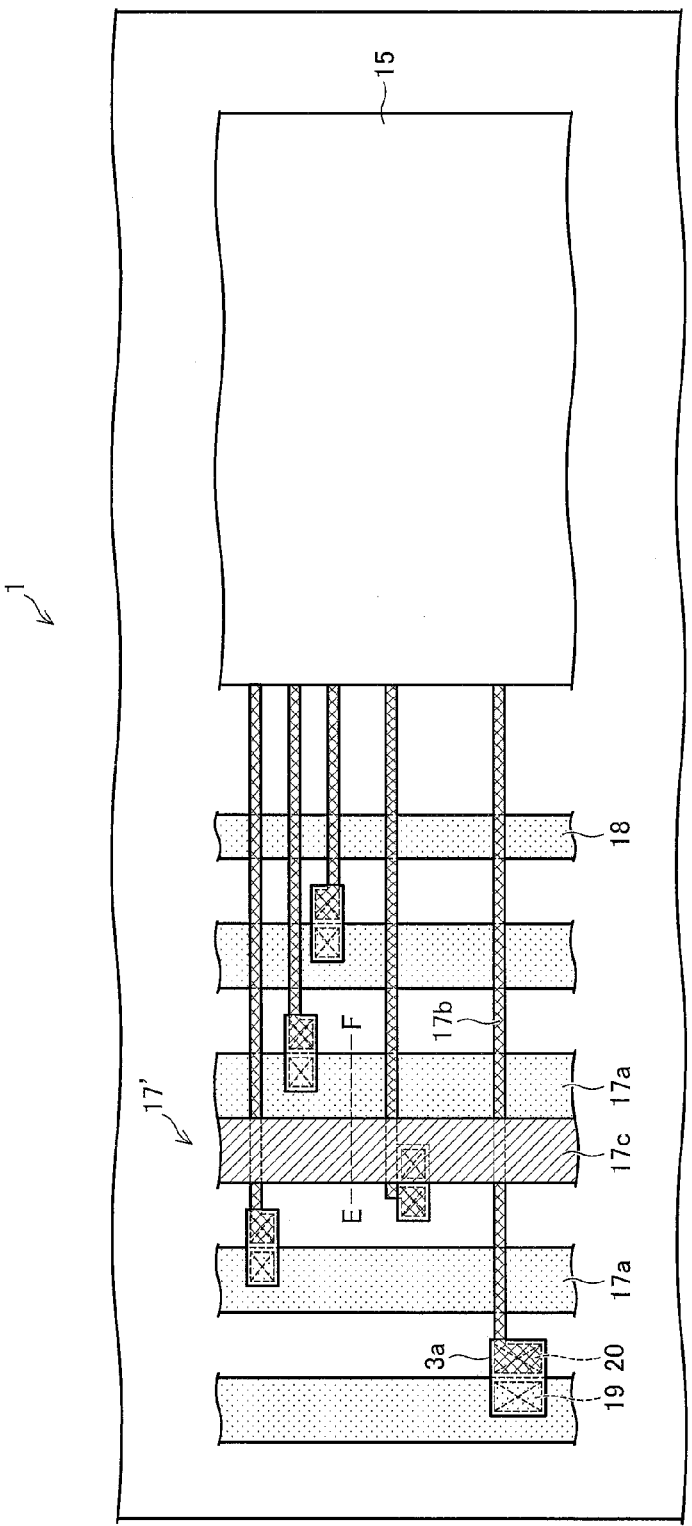
FIG. 6 is a partly enlarged view showing a region in a TFT array substrate according to another embodiment of the present invention where gate drive circuit signal wires are provided.

FIG. 6 is a partly enlarged view showing a region in a TFT array substrate 1 where gate drive circuit signal wires 17' are provided.

Figure 7:
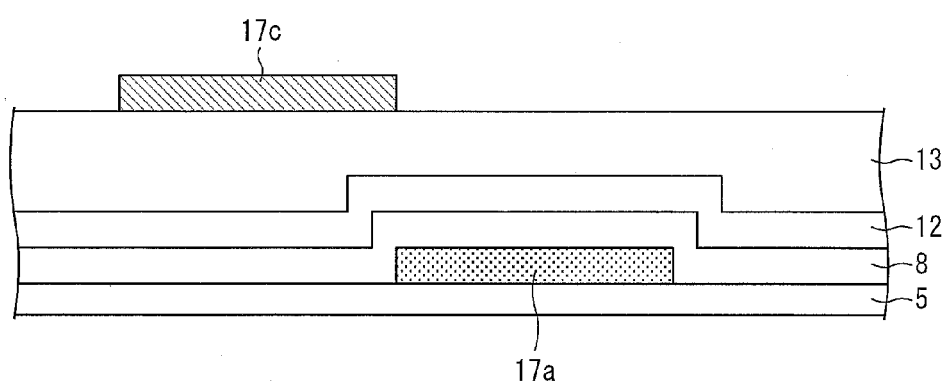
FIG. 7 is a cross-sectional view taken along the line E-F in that part of the region shown in FIG. 6 in which a first stem wire and a second stem wire are provided in such a way as to make contact with each other.

FIG. 7 is a cross-sectional view taken along the line E-F in that part of the gate drive circuit signal wires 17' of FIG. 6 in which a first stem wire 17a and a second stem wire 17c are provided in such a way as to make contact with each other.

It is preferable that the second stem wire 17c be provided in such a way as to extend along a long side of its adjacent first stem wire 17a.

In FIG. 6, as an example of this, the second stem wire 17c is provided in such a way as to, when seen in a plan view, make contact with its adjacent first stem wire 17a on the right side in the drawing.

Figure 10:
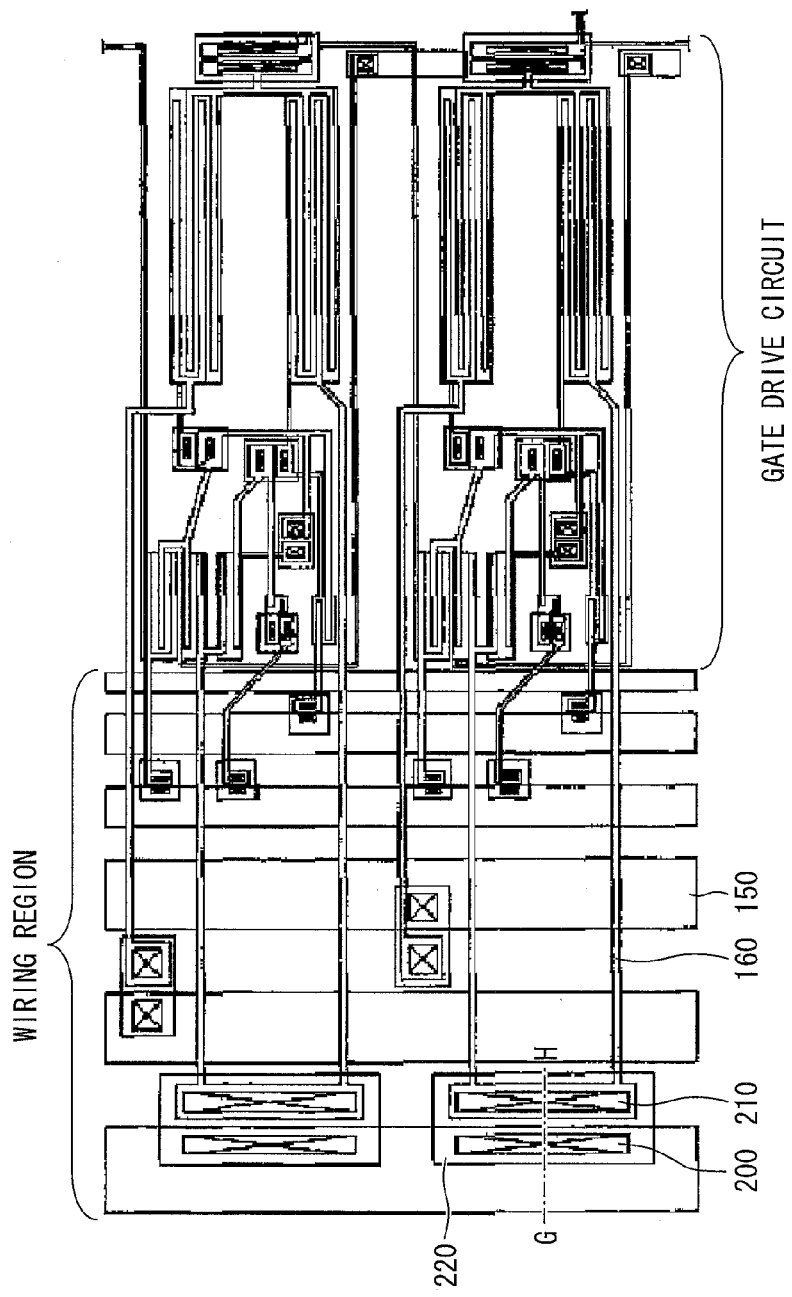
FIG. 10 is a plan view showing a conventional gate drive circuit region and wiring region.

Since, in the conventional configuration shown in FIG. 10, the main wires 150, through which external signals and the like are supplied, are all formed by the same layer as the gate electrodes, the main wires 150, through which different external signals are inputted, need to be placed at a distance from each other. This makes it difficult to reduce the intervals between the main wires 150.

Therefore, in the conventional configuration, it is difficult to reduce the width of a wiring region where the main wires 150 are provided, and the width of a frame part in which the gate drive circuit and its wires are formed cannot be reduced.

Meanwhile, in the foregoing configuration of the present embodiment, as shown in FIG. 7, the second stem wire 17c formed by the same layer as the reflective pixel electrodes 4 formed by a different layer from the first stem wires 17a formed by the same layer as the gate electrode layer 6 is provided in such a way as to, when seen in a plan view, make contact with its adjacent first stem wire 17a disposed therebelow.

Accordingly, the first and second stem wires 17a and 17c, through which different external signals are inputted, no longer need to be placed at a distance from each other. This makes it possible to increase the number of first and second stem wires 17a and 17c per unit width.

In the present embodiment, the second stem wire 17c is disposed above the first stem wire 17a, and the first stem wire 17a is disposed below the second stem wire 17c. However, the first stem wire 17a and the second stem wire 17c need only be formed by different layers from each other, and it does not particularly matter whether the second stem wire 17c is located above the first stem wire 17a or vice versa.

Further, in the present embodiment, as shown in FIG. 6, the second stem wire 17c is placed between first stem wires 17a when seen in a plan view. However, this does not imply any limitation. It is only necessary that the second stem wire 17c be provided in such a way as to extend along a long side of its adjacent first stem wire 17a.

Therefore, the foregoing configuration makes it possible to achieve a TFT array substrate 1 on which a gate drive circuit 15 and its gate drive circuit signal wires 17' have been monolithically formed, wherein the width of a frame part in which the gate drive circuit signal wires 17' are formed can be reduced.

Embodiment 3

A third embodiment of the present invention is described below with reference to FIG. 8. The present embodiment differs from Embodiments 1 and 2 in that first stem wires 17a or one or more second stem wires 17c are electrically connected to driving TFT elements T1 and T2 provided in the gate drive circuit 15 through branch wires 17b' at least one of which is formed by the same layer as the reflective pixel electrodes 4. In other respects, the present embodiment is identical in configuration to Embodiment 1 described above. For convenience of explanation, those members having the same functions as those shown in the drawings of Embodiment 1 are given the same reference numerals, and as such, are not described below.

A TFT array substrate 1 of the present embodiment is preferably configured such that first stem wires 17a or one or more second stem wires 17c are electrically connected to any of the gate, source, and drain electrodes of driving TFT elements T1 and T2 through branch wires 17b' at least one of which is formed by the same layer as the reflective pixel electrodes 4.

Figure 8:
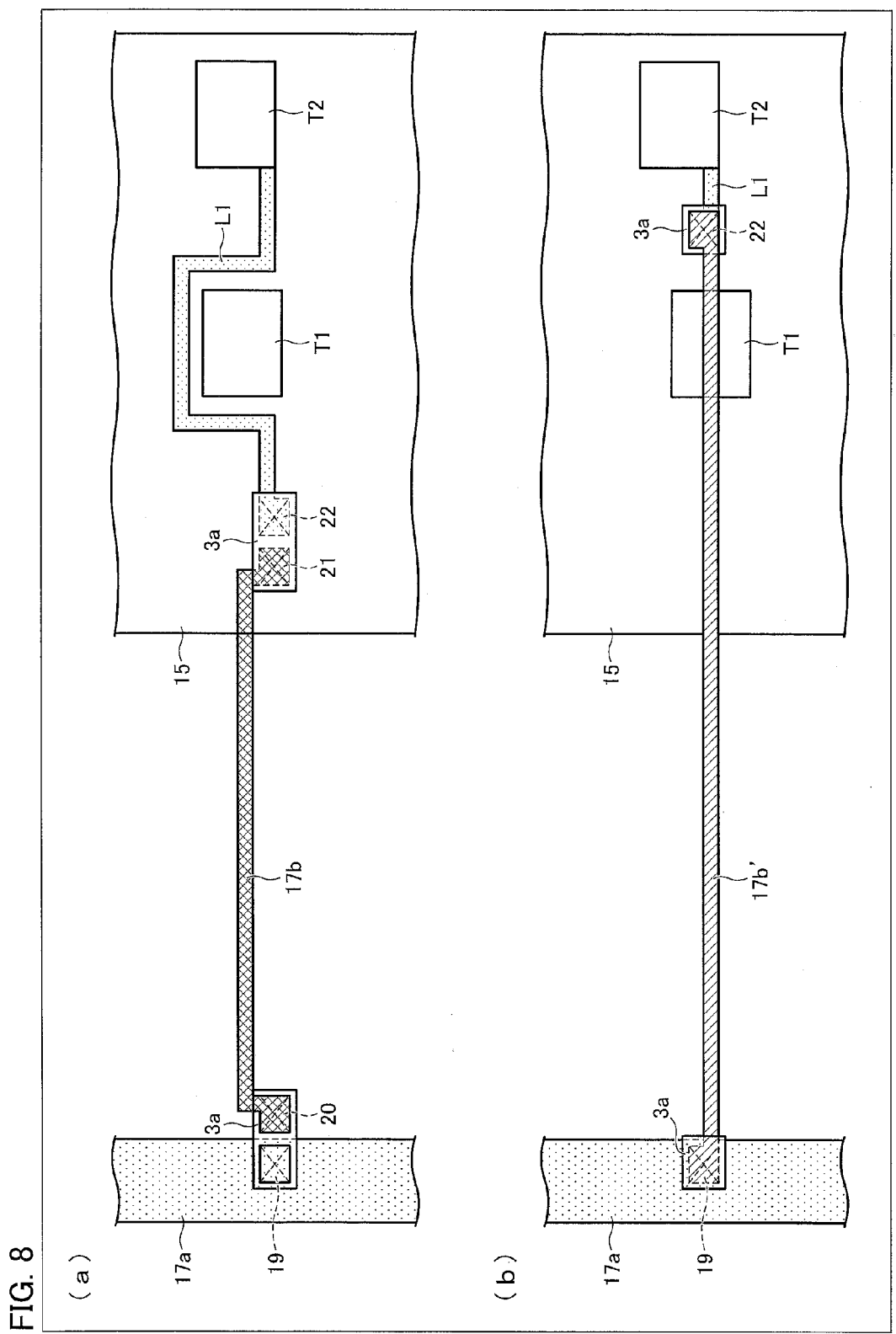
FIG. 8 is a set of diagrams (a) and (b) each showing an example of a case where a driving TFT element and a branch wire that are provided in a gate drive circuit are electrically connected to each other, (a) showing a case where a gate electrode of a driving TFT element and a branch wire formed by the same layer as a source and drain electrode layer are electrically connected to each other, (b) showing a case of still another embodiment of the present invention where a gate electrode of a driving TFT element and a branch wire formed by the same layer as reflective pixel electrodes are electrically connected to each other.

(a) of FIG. 8 shows an example of a case where the gate electrode of a driving TFT element T2 provided in the gate drive circuit 15 and a branch wire 17b electrically connected to a first stem wire 17a and formed by the same layer as the source and drain electrode layer 10 are electrically connected to each other.

Although not illustrated, each of the driving TFT elements T1 and T2 provided in the gate drive circuit 15 includes a gate electrode formed by the gate electrode layer 6 and source and drain electrodes formed by the source and drain electrode layer 10.

As shown in (a) of FIG. 8, in order that the branch wire 17b formed by the same layer as the source and drain electrode layer 10 is electrically connected to the gate electrode of the driving TFT element T2, the gate drive circuit 15 has a third contact hole 21 formed therein so that part of the branch wire 17b is exposed and has a fourth contact hole 22 formed therein so that part of a wire L1 formed by the same layer as the gate electrode layer 6 electrically connected to the gate electrode of the driving TFT element T2 is exposed.

Moreover, the branch wire 17b and the wire L1 are electrically connected to each other through a connection conductor 3a formed by the same layer as the transparent pixel electrodes 3 electrically connected to the pixel TFT elements 2 shown in FIG. 5. However, the method for electrical connection is not limited to this.

Since, as mentioned above, the driving TFT element T1 includes a gate electrode formed by the gate electrode layer 6, the wire L1 formed by the same layer as the gate electrode layer 6 circumvents the driving TFT element T1, to which the wire L1 does not need to be electrically connected.

This causes an increase in the amount of space in the gate drive circuit 15 that is occupied by the wire L1, thus making it difficult to reduce the size of the gate drive circuit 15.

Meanwhile, (b) of FIG. 8 shows an example of a case where the gate electrode of a driving TFT element T2 provided in the gate drive circuit 15 and a branch wire 17b' electrically connected to a first stem wire 17a and formed by the same layer as the reflective pixel electrodes 4 are electrically connected to each other.

The branch wire 17b' is formed by the same layer as the reflective pixel electrodes 4 formed by a different layer from the electrode layers (gate electrode layer 6, source and drain electrode layer 10) provided in the driving TFT elements T1 and T2 and from wires (wires formed by the same layers as the gate electrode layer 6 and the source and drain electrode layer 10; not illustrated) through which the gate, source, and drain electrodes of the driving TFT elements are electrically connected.

Accordingly, as shown in (b) of FIG. 8, the branch wire 17b' can avoid contact with the driving TFT element T1 and the wires without circumventing the driving TFT element T1, to which the branch wire 17b' does not need to be electrically connected, or the wires (not illustrated) through which the gate, source, and drain electrodes of the driving TFT elements are electrically connected. This makes it possible to reduce the amount of space in the gate drive circuit 15 that is occupied by the branch wire 17b' and the wire L1.

As shown in (b) of FIG. 8, in order that the first stem wire 17a or the wire L1 and the branch wire 17b' are electrically connected to each other, the present embodiment is configured by forming a first contact hole 19 and a fourth contact hole 22 so that part of the first stem wire 17a and part of the wire L1 are exposed, then forming a connection conductor 3a on the contact holes 19 and 22, and further forming the branch wire 17b' on the connection conductor 3a. However, the method for electrical connection is not limited to this.

The foregoing configuration makes it possible to achieve a TFT array substrate 1 on which a gate drive circuit 15 and its gate drive circuit signal wires 17 and 17' have been monolithically formed, wherein the width of a frame part in which the gate drive circuit 15 is formed can be reduced.

Embodiment 4

A fourth embodiment of the present invention is described below with reference to FIG. 9. The present embodiment differs from Embodiment 3 in that driving TFT elements T2 and T3 are electrically connected to each other through wires L3 at least one of which is formed by the same layer as the reflective pixel electrodes 4. In other respects, the present embodiment is identical in configuration to Embodiment 3 described above. For convenience of explanation, those members having the same functions as those shown in the drawings of Embodiment 3 are given the same reference numerals, and as such, are not described below.

A TFT array substrate 1 of the present embodiment is preferably configured such that driving TFT elements T2 and T3 are electrically connected to each other through wires L3 at least one of which is formed by the same layer as the reflective pixel electrodes 4.

Figure 9:
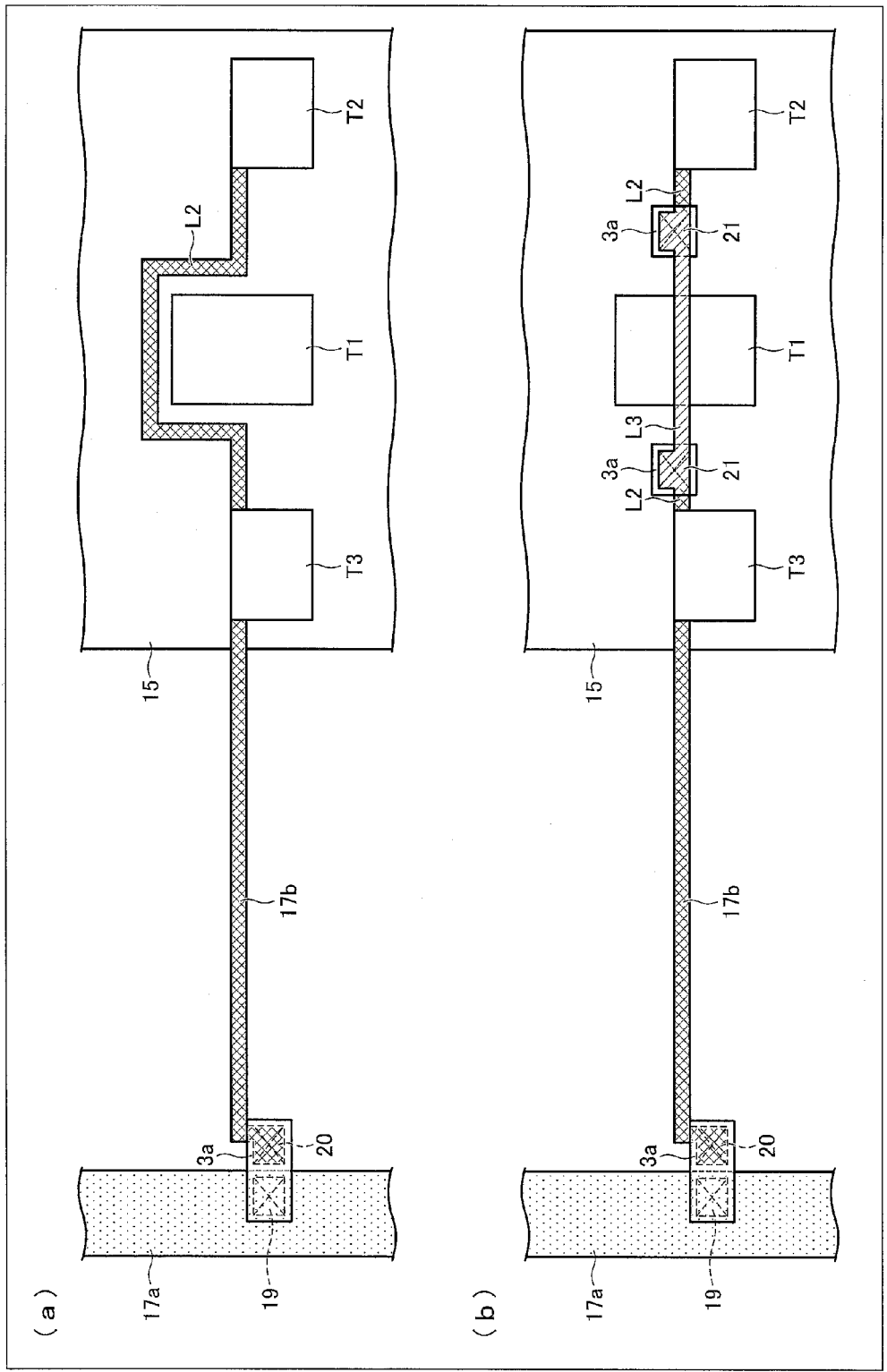
FIG. 9 is a set of diagrams (a) and (b) each showing an example of a case where driving TFT elements are electrically connected to each other through a branch wire in a gate drive circuit, (a) showing a case where driving TFT elements are electrically connected to each other through a branch wire formed by the same layer as a source and drain electrode layer, (b) showing a case of still another embodiment of the present invention where driving TFT elements are electrically connected to each other through a wire formed by the same layer as reflective pixel electrodes.

(a) of FIG. 9 shows an example of a case where the source and drain electrodes of driving TFT elements T2 and T3 are electrically connected through a branch wire 17b (wire L2 in the gate drive circuit 15) formed by the same layer as the source and drain electrode layer 10.

Since the driving TFT T1, which does not need to be electrically connected, include a gate electrode formed by the gate electrode layer 6 and source and drain electrodes formed by the source and drain electrode layer 10, the wire L2, through which the source and drain electrodes of the driving TFT elements T2 and T3 are electrically connected, circumvents the driving TFT element T1, to which the wire L2 does not need to be electrically connected, as shown in (a) of FIG. 9.

This causes an increase in the amount of space in the gate drive circuit 15 that is occupied by the wire L2, thus making it difficult to reduce the size of the gate drive circuit 15.

Meanwhile, (b) of FIG. 9 shows an example of a case where the source and drain electrodes of driving TFT elements T2 and T3 provided in the gate drive circuit 15 are electrically connected through a wire L3 formed by the same layer as the reflective pixel electrodes 4.

The wire L3, through which the driving TFT elements T2 and T3 are electrically connected to each other, is formed by the same layer as the reflective pixel electrodes 4 formed by a different layer from the electrode layers (gate electrode layer 6, source and drain electrode layer 10) provided in the driving TFT elements T1, T2, and T3 and from wires (wires formed by the same layers as the gate electrode layer 6 and the source and drain electrode layer 10; not illustrated) through which the gate, source, and drain electrodes of the driving TFT elements are electrically connected.

Accordingly, the wire L3 can avoid contact with the driving TFT element T1 and the wires without circumventing the driving TFT element T1, to which the wire L3 does not need to be electrically connected, or the wires (wires formed by the same layers as the gate electrode layer 6 and the source and drain electrode layer 10; not illustrated) through which the gate, source, and drain electrodes of driving TFT elements are electrically connected. This makes it possible to reduce the amount of space in the gate drive circuit 15 that is occupied by the wire L3, through which the driving TFT elements T2 and T3 are electrically connected to each other.

As shown in (b) of FIG. 9, in order that the wire L3 and the source and drain electrodes of the driving TFT elements T2 and T3 are electrically connected, the present embodiment is configured by forming a third contact hole 21 so that part of the wire L2 is exposed, then forming a connection conductor 3a on the third contact hole 21, and further forming the wire L3 on the connection conductor 3a. However, the method for electrical connection is not limited to this.

The foregoing configuration makes it possible to achieve a TFT array substrate 1 on which a gate drive circuit 15 and its gate drive circuit signal wires 17 and 17' have been monolithically formed, wherein the width of a frame part in which the gate drive circuit 15 is formed can be reduced.

A liquid crystal display device, which is an example of an active matrix display device of the present invention, is configured to include such a TFT array substrate 1.

Accordingly, the foregoing configuration makes it possible to achieve a liquid crystal display device that has a large display region.

Although not illustrated, the liquid crystal display device for example includes a TFT array substrate 1 and a color filter substrate facing the TFT array substrate 1, with a liquid crystal layer sealed in a space between these substrates with a sealing agent.

The foregoing description has been given by taking a liquid crystal display device as an example of an active matrix display device. However, this does not imply any limitation. The TFT array substrate 1 can of course be applied to other types of active matrix display device such as organic EL display devices.

The active matrix substrate of the present invention is preferably configured such that the at least one second stem wire is provided in such a way that at least part of it overlaps its corresponding one of the first stem wires when seen in a plan view.

According to the foregoing configuration, the at least one second stem wires is provided in such a way that at least part of it overlaps its corresponding one of the first stem wires when seen in a plan view. This allows more efficient use of a wiring region where the first stem wires and the at least one second stem wire are formed, thus making it possible to achieve an active matrix substrate on which a driving circuit and its wires have been monolithically formed, wherein the width of a frame part in which the driving circuit and its wires are formed can be reduced.

The active matrix substrate of the present invention is preferably configured such that the at least one second stem wire is electrically connected to its corresponding one of the first stem wires.

According to the foregoing configuration, the at least one second stem wire is electrically connected to its corresponding one of the first stem wires.

A combined value of resistance per unit width of a first stem wire electrically connected to such a second stem wire is smaller than a value of resistance per unit width of a first stem wire not electrically connected to such a second stem wire.

More specifically, assuming, for example, that the sheet resistance ratio of a first stem wire to a second stem wire is 1:2, the ratio of the value of resistance per unit width of a first stem wire to the combined value of resistance per unit width of a first stem wire electrically connected to such a second stem wire as can be obtained from a formula of parallel-connected resistors is 3:2.

That is, the example, in which the at least one second stem wire is electrically connected to its corresponding one of the first stem wires, can reduce the value of resistance per unit width to $2/3$ as compared to the value of resistance of a first stem wire.

Accordingly, to the extent that the value of resistance per unit width has been reduced, the line width of each of the stem wires can be reduced.

The foregoing configuration, as described above, makes it possible to achieve an active matrix substrate on which a driving circuit and its wires have been monolithically formed, wherein the width of a frame part in which the driving circuit and its wires are formed can be reduced.

The active matrix substrate of the present invention is preferably configured such that: the branch wires are formed by a same layer as either the gate electrode layer or the source and drain electrode layer; the first stem wires are formed by a same layer as an electrode layer, selected from among the gate electrode layer or the source and drain electrode layer, which is different from an electrode layer forming the branch wires; and the at least one second stem wire is formed by a same layer as the reflective pixel electrode layer.

The foregoing configuration makes it possible to achieve an active matrix substrate on which a driving circuit and its wires have been monolithically formed, wherein the width of a frame part in which the driving circuit and its wires are formed can be reduced.

The active matrix substrate of the present invention is preferably configured such that: the display region further includes transparent electrodes electrically connected to the pixel TFT elements; and the first and at least one second stem wires and the branch wires are electrically connected to each other through connection conductors formed by a same layer as the transparent pixel electrodes.

According to the foregoing configuration, the first and at least one second stem wires and the branch wires in a transflective type of active matrix substrate including reflective pixel electrodes and transparent pixel electrodes in the display region can be electrically connected by directly using the step of forming the display region.

The active matrix substrate of the present invention is preferably configured such that: the first stem wires and the at least one second stem wire are equal in wire width to each other along a direction perpendicular to their long sides and equal in length along their long sides; and the first stem wires and the at least one second stem wire have their main parts overlapping each other when seen in a plan view.

According to the foregoing configuration, the first stem wires and the at least one second stem wire are equal in wire width to each other. This allows more efficient use of a wiring region where the first stem wires and the at least one second stem wire are formed, thus making it possible to achieve an active matrix substrate on which a driving circuit and its wires have been monolithically formed, wherein the width of a frame part in which the driving circuit and its wires are formed can be reduced.

It should be noted that the clause "the first stem wires and the at least one second stem wires have their main parts overlapping each other when seen in a plan view" means a configuration in which the first stem wires and the at least one second stem wires almost entirely overlap.

The active matrix substrate of the present invention is preferably configured such that at least one of (a) a plurality of branch wires electrically connecting the first stem wires to each separate one of the driving TFT elements and (b) a branch wire(s) electrically connecting the at least one second stem wire to each separate one of the driving TFT elements is formed by the reflective pixel electrode layer.

According to the foregoing configuration, at least one of the branch wires is formed by the same layer as the reflective pixel elements formed by a different layer from the electrode layers (gate electrode layers, source and drain electrode layer) provided in the driving TFT elements and from the wires (gate electrode layer, source and drain electrode layer) through which the driving TFT elements are electrically connected to each other.

Accordingly, the branch wire can avoid contact with the driving TFT element and the wires without circumventing the driving TFT element or the wires through the driving TFT elements are electrically connected to each other. This makes it possible to reduce the amount of space in the driving circuit that is occupied by the branch wire.

This makes it possible to achieve an active matrix substrate on which a driving circuit and its wires have been monolithically formed, wherein the width of a frame part in which the driving circuit and its wires are formed can be reduced.

The active matrix substrate of the present invention is preferably configured such that the driving TFT elements are electrically connected to each other through wires at least one of which is formed by the reflective pixel electrode layer.

The wire, through which the driving TFT elements formed in the reflective pixel electrode layer are electrically connected to each other, is formed by a different layer from the electrode layers (gate electrode layer, source and drain electrode layer) provided in the driving TFT elements and from the wires (gate electrode layer, source and drain electrode layer) through which the driving TFT elements are electrically connected to each other.

Accordingly, the wire, through which the driving TFT elements formed by the reflective pixel electrode layer are electrically connected to each other, can avoid contact with the driving TFT element and the other wires without circumventing the driving TFT element or the wires (gate electrode layer 6, source and drain electrode layer) through which the driving TFT elements are electrically connected to each other. This makes it possible to reduce the amount of space in the driving circuit that is occupied by the wire, through which the driving TFT elements formed by the reflective pixel electrode layer are electrically connected to each other.

This makes it possible to achieve an active matrix substrate on which a driving circuit and its wires have been monolithically formed, wherein the width of a frame part in which the driving circuit and its wires are formed can be reduced.

The active matrix substrate of the present invention is preferably configured such that the pixel TFT elements and the driving TFT elements include an amorphous semiconductor layer.

Since the driving TFT elements including the amorphous silicon layer are low in electron mobility, they need to be formed to be large in size in order to satisfy the amount of current required of TFT elements for use in a driving circuit.

Accordingly, the driving circuit, which has the driving TFT elements including the amorphous silicon layer, is large in size; therefore, in order to reduce the width of a frame part in which the driving circuit and its wires are formed, it is necessary to reduce the width of a region where its wires are formed.

Therefore, the foregoing configuration makes it possible to achieve an active matrix substrate on which a driving circuit having driving TFT elements including an amorphous semiconductor layer and its wires have been monolithically formed, wherein the width of a frame part in which the driving circuit and its wires are formed can be reduced.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention can be applied to active matrix display devices such as liquid crystal display devices and organic EL display devices.

REFERENCE SIGNS LIST

1 TFT array substrate (active matrix substrate)
2 Pixel TFT element
3 Transparent pixel electrode
3a Connection conductor
4 Reflective pixel electrode
5 Insulating substrate
6 Gate electrode layer
9 Amorphous silicon film (amorphous semiconductor layer)
10 Source and drain electrode layer
15 Gate drive circuit (driving circuit)
17a First stem wire
17b, 17b' Branch wire
17c Second stem wire
T1, T2, T3 Driving TFT element
L1, L2, L3 Wire through which driving TFT element are electrically connected to each other
R1 Display region
R2 Peripheral region
W1, W2 Line width

The invention claimed is:
1. An active matrix substrate comprising an insulating substrate,
the insulating substrate having a display region including a plurality of pixel TFT elements and reflective pixel electrodes,
the insulating substrate having a peripheral region, surrounding the display region, which includes a plurality of driving TFT elements for driving the pixel TFT elements,
the peripheral region further including branch wires electrically connected to the driving TFT elements and first stem wires, electrically connected to the branch wires, through which external signals are inputted,
the pixel TFT elements and the driving TFT elements including a gate electrode layer and a source and drain electrode layer,
the reflective pixel electrodes being formed by a reflective pixel electrode layer that is different from the gate electrode layer and the source and drain electrode layers,
the peripheral region having at least one second stem wire formed therein to extend along long sides of the first stem wires, the first stem wires, the at least one second stem wire, and the branch wires being formed by different layers selected from among the gate electrode layer, the source and drain electrode layer, and the reflective pixel electrode layer, respectively, wherein the display region further includes transparent pixel electrodes electrically connected to the pixel TFT elements; and the first and at least one second stem wires and the branch wires are electrically connected to each other through connection conductors formed by a same layer as the transparent pixel electrodes.

2. The active matrix substrate as set forth in claim 1, wherein the at least one second stem wire is provided in such a way that at least part of it overlaps its corresponding one of the first stem wires when seen in a plan view.

3. The active matrix substrate as set forth in claim 1, wherein the at least one second stem wire is electrically connected to its corresponding one of the first stem wires.

4. The active matrix substrate as set forth in claim 1, wherein:

the branch wires are formed by a same layer as either the gate electrode layer or the source and drain electrode layer;

the first stem wires are formed by a same layer as an electrode layer, selected from among the gate electrode layer or the source and drain electrode layer, which is different from an electrode layer forming the branch wires; and the at least one second stem wire is formed by a same layer as the reflective pixel electrode layer.

5. The active matrix substrate as set forth in claim 2, wherein:

the first stem wires and the at least one second stem wire are equal in wire width to each other along a direction perpendicular to their long sides and equal in length along their long sides; and the first stem wires and the at least one second stem wire have their main parts overlapping each other when seen in a plan view.

6. The active matrix substrate as set forth in claim 1, wherein at least one of (a) a plurality of branch wires electrically connecting the first stem wires to each separate one of the driving TFT elements and (b) a branch wire(s) electrically connecting the at least one second stem wire to each separate one of the driving TFT elements is formed by the reflective pixel electrode layer.

7. The active matrix substrate as set forth in claim 1, wherein the driving TFT elements are electrically connected to each other through wires at least one of which is formed by the reflective pixel electrode layer.

8. The active matrix substrate as set forth in claim 1, wherein the pixel TFT elements and the driving TFT elements include an amorphous semiconductor layer.

9. An active matrix display device comprising an active matrix substrate as set forth in claim 1.

* * * * *